US010833219B2

(12) United States Patent
Tonkikh et al.

(10) Patent No.: US 10,833,219 B2
(45) Date of Patent: Nov. 10, 2020

(54) EPITAXIAL CONVERSION ELEMENT, METHOD FOR PRODUCING AN EPITAXIAL CONVERSION ELEMENT, RADIATION EMITTING RGB UNIT AND METHOD FOR PRODUCING A RADIATION EMITTING RGB UNIT

(71) Applicant: OSRAM Opto Semiconductors GmbH, Regensburg (DE)

(72) Inventors: Alexander Tonkikh, Regensburg (DE); Andreas Plößl, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/252,323

(22) Filed: Jan. 18, 2019

(65) Prior Publication Data
US 2019/0221706 A1  Jul. 18, 2019

(30) Foreign Application Priority Data
Jan. 18, 2018  (DE) .................. 10 2018 101 086

(51) Int. Cl.
*H01L 33/00* (2010.01)
*H01L 33/50* (2010.01)
(Continued)

(52) U.S. Cl.
CPC ........ *H01L 33/0025* (2013.01); *H01L 33/007* (2013.01); *H01L 33/0093* (2020.05);
(Continued)

(58) Field of Classification Search
CPC ......... H01L 2933/0041; H01L 33/0025; H01L 33/007; H01L 33/0079; H01L 33/08; H01L 33/30; H01L 33/32; H01L 33/502
(Continued)

(56) References Cited

U.S. PATENT DOCUMENTS

| 2006/0007373 A1* | 1/2006 | Arai ................ G02B 5/201 |
| | | 349/113 |
| 2014/0339580 A1* | 11/2014 | Park ................ H01L 33/08 |
| | | 257/90 |

(Continued)

FOREIGN PATENT DOCUMENTS

| DE | 102016220915 A1 | 4/2018 |
| DE | 102017120522 A1 | 3/2019 |

OTHER PUBLICATIONS

Haase, M., et al., "II-VI semiconductor color converters for efficient green, yellow, and red light emitting diodes," Applied Physics Letters, No. 96, Jun. 11, 2010, pp. 1-3.
(Continued)

*Primary Examiner* — Duy T Nguyen
(74) *Attorney, Agent, or Firm* — Slater Matsil, LLP

(57) ABSTRACT

An epitaxial conversion element, a method for producing an epitaxial conversion element, a radiation emitting RGB unit and a method for producing a radiation emitting RGB unit are disclosed. In an embodiment an epitaxial conversion element includes a green converting epitaxial layer configured to convert electromagnetic radiation from a blue spectral range into electromagnetic radiation of a green spectral range and a red converting epitaxial layer configured to convert electromagnetic radiation from the blue spectral range into electromagnetic radiation of a red spectral range, wherein the green converting epitaxial layer and the red converting epitaxial layer are based on a phosphide compound semiconductor material, and wherein the green converting epitaxial layer and the red converting epitaxial layer are in different main extension planes which are parallel to each other.

20 Claims, 8 Drawing Sheets

(51) Int. Cl.
　　　*H01L 33/08*　　　(2010.01)
　　　*H01L 33/30*　　　(2010.01)
　　　*H01L 33/32*　　　(2010.01)
(52) U.S. Cl.
　　　CPC .............. *H01L 33/08* (2013.01); *H01L 33/30*
　　　　　　(2013.01); *H01L 33/32* (2013.01); *H01L*
　　　　*33/502* (2013.01); *H01L 2933/0041* (2013.01)
(58) Field of Classification Search
　　　USPC .......................................................... 257/94
　　　See application file for complete search history.

(56) References Cited

U.S. PATENT DOCUMENTS

| | | | |
|---|---|---|---|
| 2015/0090972 A1* | 4/2015 | Lee ..................... | H01L 27/3211 257/40 |
| 2016/0358969 A1* | 12/2016 | Fu ..................... | H01L 27/14645 |
| 2018/0083226 A1* | 3/2018 | Ichikawa ............. | H01L 51/5056 |
| 2018/0164640 A1* | 6/2018 | Kim ................. | G02F 1/133606 |

OTHER PUBLICATIONS

Kang, C., et al., "Fabrication of a vertically-stacked passive-matrix micro-LED array structure for a dual color display," Optics Express, vol. 25, No. 3, Feb. 6, 2017, pp. 2489-2495.

* cited by examiner

EPITAXIAL CONVERSION ELEMENT, METHOD FOR PRODUCING AN EPITAXIAL CONVERSION ELEMENT, RADIATION EMITTING RGB UNIT AND METHOD FOR PRODUCING A RADIATION EMITTING RGB UNIT

CROSS-REFERENCE TO RELATED APPLICATIONS

This application claims the benefit of German patent application 102018101086.9, filed on Jan. 18, 2018, which application is hereby incorporated herein by reference.

TECHNICAL FIELD

An epitaxial conversion element, a method for producing an epitaxial conversion element, a radiation emitting RGB unit and a method for producing a radiation emitting RGB unit are provided.

BACKGROUND

A conversion element, for example, is described in German Application No. 10 2016 220 915.9.

SUMMARY

Embodiments provide a conversion element having at least two different converting regions that are particularly precise in shape and arrangement. Further embodiments provide a method for producing such a conversion element. Yet other embodiments provide an improved RGB unit and a method for its manufacture.

Advantageous embodiments and further developments of the epitaxial conversion element, the method for producing the epitaxial conversion element, the radiation-emitting RGB unit and the method for producing a radiation-emitting RGB unit are specified in the respective dependent claims.

According to one embodiment, an epitaxial conversion element comprises a green converting epitaxial layer that converts electromagnetic radiation from a blue spectral range into electromagnetic radiation from a green spectral range.

According to another embodiment of the epitaxial conversion element, it comprises a red converting epitaxial layer that converts electromagnetic radiation from the blue spectral range into electromagnetic radiation from a red spectral range.

According to another embodiment of the epitaxial conversion element, the green converting epitaxial layer is based on a phosphide compound semiconductor material or consists of a phosphide compound semiconductor material. The red converting epitaxial layer is also based on a phosphide compound semiconductor material or consists of a phosphide compound semiconductor material.

Phosphide compound semiconductor materials are compound semiconductor materials that contain phosphorus, such as materials from the $In_xAl_yGa_{1-x-y}P$ system with $0 \leq x \leq 1$, $0 \leq y \leq 1$ and $x+y \leq 1$.

Thus, the red converting epitaxial layer and the green converting epitaxial layer are preferably based on the same material system, namely on the phosphide compound semiconductor material. This reduces production costs to an advantage.

The two converting layers are preferably epitaxially grown and each has a semiconductor material with a band gap between a valence band and a conduction band. The wavelength converting properties of the epitaxial converting layers are based on the photoluminescence of the semiconductor material of the epitaxial converting layers. The semiconductor material of the epitaxial converting layers absorbs electromagnetic radiation of a wavelength range, preferably from the blue wavelength range, so that states in the conduction band of the semiconductor material are excited which relax by emitting electromagnetic radiation of a further wavelength range. The further wavelength range preferably includes longer wavelengths than the wavelength range that is absorbed. In this case, the further wavelength range preferably shows red or green light.

The green converting epitaxial layer and the red converting epitaxial layer are preferably in different main extension planars, which are arranged parallel to each other.

For example, the red converting epitaxial layer and/or the green converting layer has a thickness between 0.05 micrometers and 5 micrometers inclusive. Especially preferred is the red converting epitaxial layer and/or the green converting layer with a thickness between 0.1 micrometer and 1 micrometer inclusive.

Especially preferred are the green converting epitaxial layer and the red converting epitaxial layer growing epitaxially on a common growth substrate. For example, the growth substrate contains gallium arsenide or is formed from gallium arsenide.

The growth substrate may be completely or partially enclosed by the finished epitaxial conversion element. It is also possible that the growth substrate is completely removed from the epitaxial conversion element. If the epitaxial conversion element comprises the growth substrate no longer, the epitaxial conversion element is preferably applied either to a carrier or to another functional element, such as a radiation-emitting semiconductor layer sequence, for mechanical stabilization.

The green converting epitaxial layer and the red converting epitaxial layer are preferably lattice-adapted to the growth substrate, like gallium arsenide. The lattice adaptation of the green converting epitaxial layer and the red converting epitaxial layer is generated by epitaxial deposition of the two converting epitaxial layers on a common growth substrate.

According to another embodiment of the epitaxial conversion element, the green converting epitaxial layer and the red converting epitaxial layer have substantially the same crystal lattice. This is particularly the case when the two epitaxial converting layers are grown on a common growth substrate. In particular, the green converting epitaxial layer and the red converting epitaxial layer preferably have a cubic crystal lattice. A cubic crystal lattice is particularly typical for epitaxially grown layers based on a phosphide compound semiconductor material or consisting of a phosphide compound semiconductor material.

According to another embodiment of the epitaxial conversion element, the green converting epitaxial layer and the red converting epitaxial layer have essentially the same lattice constant along their main extension planars. This characteristic is usually given when the green converting epitaxial layer and the red converting epitaxial layer have been epitaxially grown on a common growth substrate such as gallium arsenide. For example, the green converting epitaxial layer and the red converting epitaxial layer have a lattice constant of about 6.65 Ångström. The term "that the green converting epitaxial layer and the red converting epitaxial layer have substantially the same lattice constant" means preferably that the lattice constant of the green converting epitaxial layer and the lattice constant of the red converting epitaxial layer do not differ by more than 1%.

The epitaxial conversion element is particularly preferred to be free of bonding layers, such as adhesive layers or bond layers, which serve, for example, to bond the two converting epitaxial layers. The epitaxial conversion element is particularly preferred to be monolithic.

According to a further version of the epitaxial conversion element, all layers of the epitaxial conversion element are grown epitaxially, especially preferred on a common growth substrate. Preferably, all layers of the epitaxial conversion element are lattice-adapted to each other.

According to an embodiment, the epitaxial conversion element comprises at least one barrier layer. Preferably, the barrier layer is arranged between a radiation entrance surface of the conversion element and the green converting epitaxial layer and/or the red converting epitaxial layer. The radiation entrance surface is arranged opposite to a radiation exit surface of the conversion element.

According to another embodiment of the epitaxial conversion element, the red converting epitaxial layer is disposed between two barrier layers. The barrier layers are preferably provided to enclose electrical charge carriers, such as electrons and holes, within the red converting epitaxial layer.

According to a further embodiment of the epitaxial conversion element, the green converting epitaxial layer is also disposed between two barrier layers. These barrier layers are also provided to concentrate the electrical charge carriers, such as electrons and holes, within the green converting epitaxial layer. The barrier layers increase the efficiency of the epitaxial conversion element to an advantage.

Especially preferred the two barrier layers are in direct contact with the red converting epitaxial layer or the green converting epitaxial layer. The barrier layers are preferably grown epitaxially. The barrier layers are also preferably based on a phosphide compound semiconductor material. For example, the barrier layers are between 5 nanometers and 1000 nanometers thick. Barrier layers are particularly preferred with thicknesses ranging from 5 nanometers to 20 nanometers inclusive.

According to another embodiment of the epitaxial conversion element, a top layer is arranged between the red converting epitaxial layer and a radiation exit surface of the epitaxial conversion element. The top layer is particularly transparent for electromagnetic radiation in the red spectral range and for electromagnetic radiation in the green spectral range. "Transparent" means that the top layer transmits at least 80% and preferably at least 95% of the respective electromagnetic radiation.

Furthermore, it is also possible that a top layer is arranged between the radiation exit surface of the epitaxial conversion element and the green converting epitaxial layer. For example, the surface layer is grown epitaxially.

According to another embodiment of the epitaxial conversion element, the top layer has a roughened surface. The surface of the top layer can also be structured. The roughening or structuring of the top layer serves for better light extraction from the epitaxial conversion element. For example, the top layer is between 5 nanometers and 2 micrometers thick. The preferred thickness of the top layer is between 200 nanometers and 500 nanometers.

The top layer, for example, has an oxide, such as silicon dioxide, or is made of such a material. A top layer containing silicon dioxide can be mechanically stably bonded to an epitaxial semiconductor layer sequence by bonding, for example.

According to another embodiment of the epitaxial conversion element, the green converting epitaxial layer is comprised of or forms a green converting region. The red converting epitaxial layer may also be surrounded by or form a red converting region. The red converting region and the green converting region do not overlap laterally. In this way, locally separated regions are created which convert electromagnetic radiation of the blue spectral range into electromagnetic radiation of different wavelength ranges, namely the red spectral range and the green spectral range.

Preferably, the green converting region has a width not greater than 100 microns. Particularly preferred is the width of the green converting region not larger than 10 micrometers and particularly preferred not larger than 1 micrometer.

Preferably, the red converting region has a width not greater than 100 micrometers. Particularly preferred is the width of the red converting region not larger than 10 micrometers and particularly preferred not larger than 1 micrometer.

According to an embodiment of the method for producing an epitaxial conversion element, a growth substrate is provided in a first step.

According to another embodiment of the method, a red converting epitaxial layer is deposited epitaxially, for example, directly or indirectly on the growth substrate. The red converting layer is preferably based on a phosphide compound semiconductor material. The red converting epitaxial layer can be deposited in direct contact on the growth substrate. Alternatively, it is also possible that another layer is already deposited on the growth substrate, preferably also by epitaxial growth. The other layer can, for example, be a barrier layer or a top layer. The red converting epitaxial layer preferably converts electromagnetic radiation from the blue spectral range into electromagnetic radiation from the red spectral range.

According to a further embodiment of the method for the production of an epitaxial conversion element, a green converting epitaxial layer is deposited epitaxially. The green converting epitaxial layer is also preferably based on a phosphide compound semiconductor material. The green converting epitaxial layer preferably converts electromagnetic radiation from the blue spectral range into electromagnetic radiation from the green spectral range.

For example, the green converting epitaxial layer can be deposited in direct contact with the red converting epitaxial layer. Furthermore, it is also possible that between the red converting epitaxial layer and the green converting epitaxial layer further layers are deposited, which are preferably also epitaxially grown. These layers can, for example, be the barrier layers or top layers described above.

According to a further embodiment, the red converting epitaxial layer is structured into a multitude of red converting regions, e.g., by etching.

According to a further embodiment of the method, a first transparent planarization layer is deposited on the red converting regions, resulting in a first planar surface. The material of the first transparent planarization layer preferentially fills recesses that were created during the structuring of the red converting epitaxial layer into red converting regions. The material of the first transparent planarization layer fills the recesses completely, with particular preference. Preferably the first planar surface is completely made of the material of the first transparent planarization layer.

According to a further embodiment, a carrier is attached mechanically stable to the first planar surface. The carrier mechanically stabilizes the epitaxial layers. The carrier is preferably transparent.

According to a further embodiment of the method, the growth substrate is removed and the green converting epitaxial layer is structured into a multitude of green converting areas, for example, also with etching.

According to a further embodiment of the method, a second transparent planarization layer is deposited on the green converting regions, resulting in a second planar surface. The material of the second transparent planarization layer preferentially fills recesses, which were created during the structuring of the green converting epitaxial layer into green converting regions. The material of the second transparent planarization layer fills the recesses completely, with particular preference. Preferably, the second planar surface is completely made of the material of the second transparent planarization layer.

Between the red converting epitaxial layer and the green converting epitaxial layer an etch stop layer can be arranged, which stops the etching method when structuring the epitaxial layers. The etch stop layer prefers a significantly lower etch rate compared to the red converting epitaxial layer and/or the green converting epitaxial layer.

The etch stop layer is preferably based on or consists of an arsenide compound semiconductor material. Arsenide compound semiconductor materials are compound semiconductor materials which contain arsenic, such as materials from the $In_xAl_yGa_{1-x-y}As$ system with $0 \leq x \leq 1$, $0 \leq y \leq 1$ and $x+y \leq 1$. The arsenide compound semiconductor material has in particular no indium.

Characteristics and embodiments described herein in connection with the epitaxial conversion element may also be present in the method for producing the epitaxial conversion element and vice versa.

By epitaxially growing the converting layers, it is advantageously possible to create converting regions of comparatively small dimensions with accurate shape and dimensions. This can be used in particular to produce a radiation-emitting RGB unit with small pixels.

The epitaxial conversion element described here is particularly suitable for use in a radiation-emitting RGB unit. The radiation-emitting RGB unit is particularly suitable for different emission regions that emit red light, green light and blue light separately.

Characteristics and embodiments described here in conjunction with the epitaxial conversion element may also be present in the radiation emitting RGB unit and vice versa.

According to an embodiment of the radiation-emitting RGB unit, it comprises an active, radiation-generating zone that generates electromagnetic radiation from the blue spectral range. For example, the active radiation generating zone is based on a nitride compound semiconductor material.

Nitride compound semiconductor materials are compound semiconductor materials containing nitrogen, such as materials from the $In_xAl_yGa_{1-x-y}N$ system with $0 \leq x \leq 1$, $0 \leq y \leq 1$ and $x+y \leq 1$.

Particularly preferred, the radiation-emitting RGB unit has an epitaxial conversion element, as already described. The green converting epitaxial layer of the epitaxial conversion element and the red converting epitaxial layer of the epitaxial conversion element convert the electromagnetic radiation of the active zone partially and especially completely into the respective wavelength ranges.

A main extension planar of the active zone is preferably arranged parallel to the main extension planars of the green converting epitaxial layer and the red converting epitaxial layer.

Particularly preferred, the radiation-emitting RGB unit has a radiation exit surface that comprises a red emission region, a green emission region and a blue emission region. From the green emission region, green converted radiation of the green converting epitaxial layer is emitted especially preferentially. Red converted radiation of the red converting epitaxial layer is emitted particularly preferably from the red emission region. Of the blue emission region, blue unconverted radiation of the active zone is particularly preferred.

The red emission region is particularly preferred in one radiation direction to the red converting region. The green emission region is particularly preferred in the radiation direction to the green converting region. Especially preferred is the red emission region congruent with the red converting region and the green emission region congruent with the green converting region.

A red emission region, a green emission region and a blue emission region can form a pixel together. A radiation-emitting RGB unit can have several pixels or just one pixel.

The blue emission region and/or the green emission region and/or the red emission region are particularly preferred to have the same width as the corresponding converting region. The blue emission region and/or the green emission region and/or the red emission region shall preferably have a width not exceeding 100 micrometers. The width of the blue emission region and/or the green emission region and/or the red emission region shall not be more than 10 micrometers or more than 1 micrometer.

The radiation emitting RGB unit can be used in a display, a display device or a light tile. Furthermore, the RGB unit can also be provided as an RGB semiconductor chip with one or more pixels.

For example, the RGB unit can be generated using the method described below. Features and embodiments described herein, in connection with the conversion element or the method for producing, may also be present in the RGB unit or the method for its producing and vice versa.

A growth substrate is provided according to an embodiment of the method for producing a radiation-emitting RGB unit. On or above the growth substrate, a red converting epitaxial layer based on a phosphide compound semiconductor material, which converts the electromagnetic radiation from the blue spectral range into electromagnetic radiation from a red spectral range, is epitaxially deposited.

According to another embodiment of the method for producing a radiation emitting RGB unit, a green converting epitaxial layer based on a phosphide compound semiconductor material which converts the electromagnetic radiation from the blue spectral range into electromagnetic radiation from a green spectral range is epitaxially deposited.

The red converting epitaxial layer can be deposited directly on the growth substrate or separated by other layers, such as the barrier layer or the top layer.

The green converting epitaxial layer can be deposited directly on the red converting epitaxial layer or separated by further layers, e.g., by the barrier layer and/or the top layer.

Furthermore, it is also possible that first the green converting epitaxial layer and then the red converting epitaxial layer are deposited epitaxially.

The red converting epitaxial layer is especially preferably structured into a multitude of red converting regions, e.g., by etching.

According to a further embodiment of the method, a first transparent planarization layer is deposited on the red converting regions, resulting in a first planar surface. The first planarization layer can cover the red converting regions or even fill up recesses, which result from the structuring of the red converting epitaxial layer.

According to a further embodiment of the method, a radiation-emitting epitaxial semiconductor layer sequence is connected to the first planar surface. The active zone is especially provided to emit electromagnetic radiation in the blue spectral range. The epitaxial semiconductor layer sequence is particularly preferred on a carrier element. The carrier element stabilizes the epitaxial semiconductor layer sequence particularly mechanically. For example, the carrier element can be a growth substrate for the epitaxial semiconductor layer sequence. If the epitaxial semiconductor layer sequence is based on a nitride compound semiconductor material, the carrier element may, for example, contain sapphire or silicon carbide or consist of one of these materials. These materials are suitable as growth substrates for nitride compound semiconductor materials.

Furthermore, it is also possible that the carrier element is different from a growth substrate for the epitaxial semiconductor layer sequence. A mirror layer can be disposed between the carrier element and the epitaxial semiconductor layer sequence, which deflects electromagnetic radiation from the active zone to a radiation exit surface of the RGB unit in operation.

According to a further embodiment of the method side surfaces of the red converting regions and/or the green converting regions are provided with a mirroring layer. The reflective layer reduces crosstalk between adjacent converting regions with advantage.

For example, the reflective layer may contain a metal or consist of a metal. Furthermore, the reflective layer may also contain one or more dielectric materials, such as oxides and/or nitrides, such as $SiO_x$, $HfO_x$ or SiN. For example, the thickness of the reflective layer is between 50 nanometers and 500 nanometers.

According to a further embodiment of the method, a second transparent planarization layer is applied to the green converting regions so that a second planar surface is formed. The material of the second transparent planarization layer fills especially the recesses, which were created during the structuring of the green converting epitaxial layer into green converting regions.

The first planarization layer and/or the second planarization layer may, for example, contain silicon dioxide or a flowable oxide or be made of one of these materials. Furthermore, the first planarization layer and/or the second planarization layer may also contain or consist of diamond like carbon. A planarization layer containing diamond-like carbon improves heat dissipation.

According to another embodiment, the second planar surface is provided with decoupling structures that improve the decoupling of electromagnetic radiation from the RGB unit.

In the method described here, the RGB unit is generated particularly preferably at wafer level. The RGB unit can be separated into a number of subunits or into RGB semiconductor chips, for example, by sawing.

The present application proposes to generate conversion elements epitaxially. This enables the creation of comparatively small, differently converting regions with well-defined shapes, such as those required for pixels. The epitaxial layers of the epitaxial conversion element can be structured very precisely and can also be generated together with an active zone of an epitaxial semiconductor layer sequence, which generates the primary electromagnetic radiation to be converted.

Compared to the use of individual light-emitting diodes in different colors, the proposed use of epitaxial conversion elements reduces the effort required for assembly. Compared to the use of fluorescent particles for the conversion of electromagnetic radiation, the proposed use of epitaxial conversion elements has the advantage of being able to have smaller structures, since the particle size of the fluorescent particles limits the dimensions. In particular, it is advantageously possible to generate converting regions with a width below 10 micrometers.

BRIEF DESCRIPTION OF THE DRAWINGS

Further advantageous embodiments and further development of the epitaxial conversion element, the method for producing an epitaxial conversion element, the radiation-emitting RGB unit and the method for producing the radiation-emitting RGB unit result from the embodiments described below in connection with the figures.

FIG. 7 also shows a schematic cross-section of an epitaxial conversion element according to an embodiment;

Same, similar or similar elements are in the figures provided with the same reference signs. The figures and the proportions of the elements depicted in the figures are not to be regarded as true to scale. Rather, individual elements, in particular layer thicknesses, may be exaggeratedly large for better representability and/or better understanding.

DETAILED DESCRIPTION OF ILLUSTRATIVE EMBODIMENTS

Figure 1:
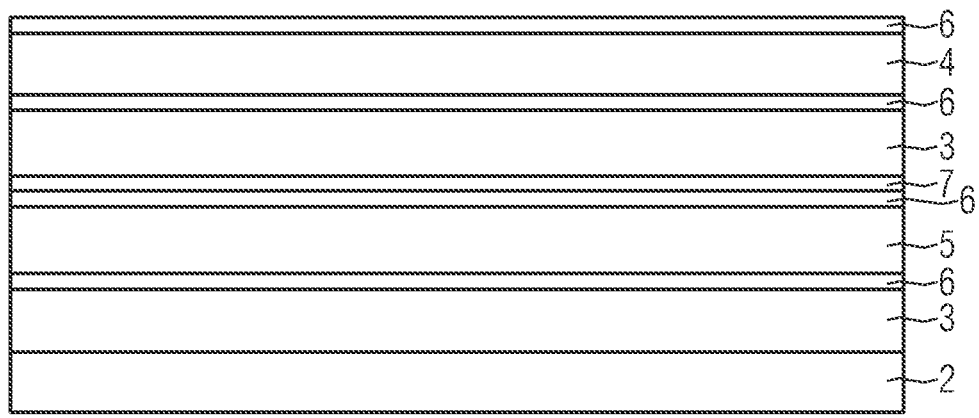
FIGS. 1 to 7 show a method for the production of an epitaxial conversion element according to an embodiment.

In the method for producing an epitaxial conversion element 1 as shown in the embodiment in FIGS. 1 to 6, a plurality of layers are first formed on a growth substrate 2 as shown in FIG. 1. The growth substrate 2 is presently formed from gallium arsenide or has gallium arsenide. Some layers are grown epitaxially, but not necessarily all of them.

The sequence of layers shown in FIG. 1 shows a roughened or decoupled top layer 3 deposited on growth substrate 2. The top layer 3 is transparent to radiation of a red converting epitaxial layer 4 and a green converting epitaxial layer 5.

A barrier layer 6 is arranged on top layer 3, on which the green converting epitaxial layer 5 is epitaxially deposited. The green converting epitaxial layer 5 is also preferred to convert electromagnetic radiation of the blue spectral range into electromagnetic radiation of the green spectral range.

Barrier layer 6 is also preferably deposited epitaxially on top layer 3. On the green converting epitaxial layer 5 another barrier layer 6 is applied, also preferably epitaxial. The green converting epitaxial layer 5 is thus enclosed between two barrier layers 6, which serve to concentrate electrical charge carriers in the green converting epitaxial layer 5.

The green converting epitaxial layer 5 and the red converting epitaxial layer 4 are arranged in different main extension planars which are parallel to each other.

An etch stop layer 7, preferably based on an arsenide compound semiconductor material such as gallium arsenide, is arranged on the further barrier layer 6.

A further top layer 3 is applied to the etch stop layer 7, which can be provided with decoupling structures or roughened. On top layer 3 there is another barrier layer 6, followed by the red converting epitaxial layer 4. The red converting epitaxial layer 4 is suitable to convert electromagnetic radiation of the blue spectral range into electromagnetic radiation of the red spectral range.

A further barrier layer 6 is arranged on the red converting epitaxial layer 4. The two barrier layers 6 include the red converting epitaxial layer 4 and concentrate the electric charge carriers in the red converting epitaxial layer 4.

The green converting epitaxial layer 5 and the red converting epitaxial layer 4 are both preferably based on or formed from a phosphide compound semiconductor material.

The two top layers 3 are particularly transparent to electromagnetic radiation of the red spectral range and/or the green spectral range.

Figure 2:
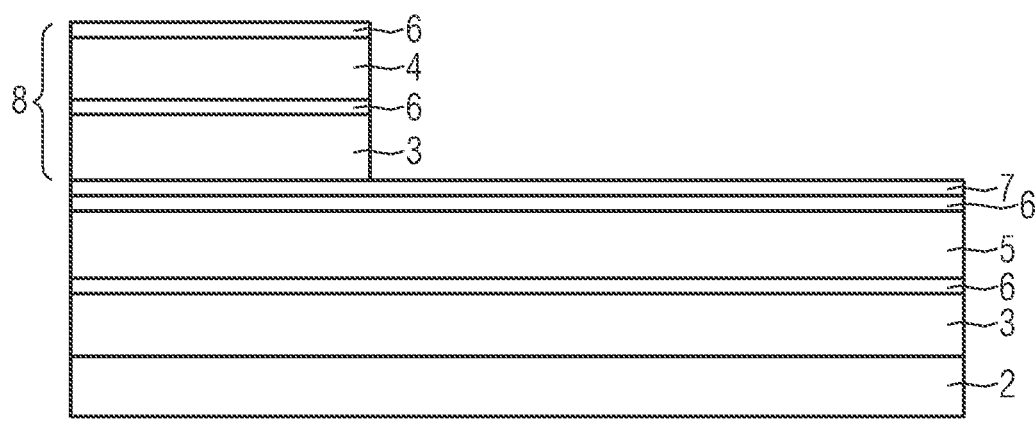

In a next step schematically shown in FIG. 2, the red converting epitaxial layer 4 and the barrier layers 6 including the red converting epitaxial layer 4 and the second top layer 3 are structured to form a red converting region 8 comprising the red converting epitaxial layer 4. Etching is carried out up to the etch stop layer 7.

Figure 3:
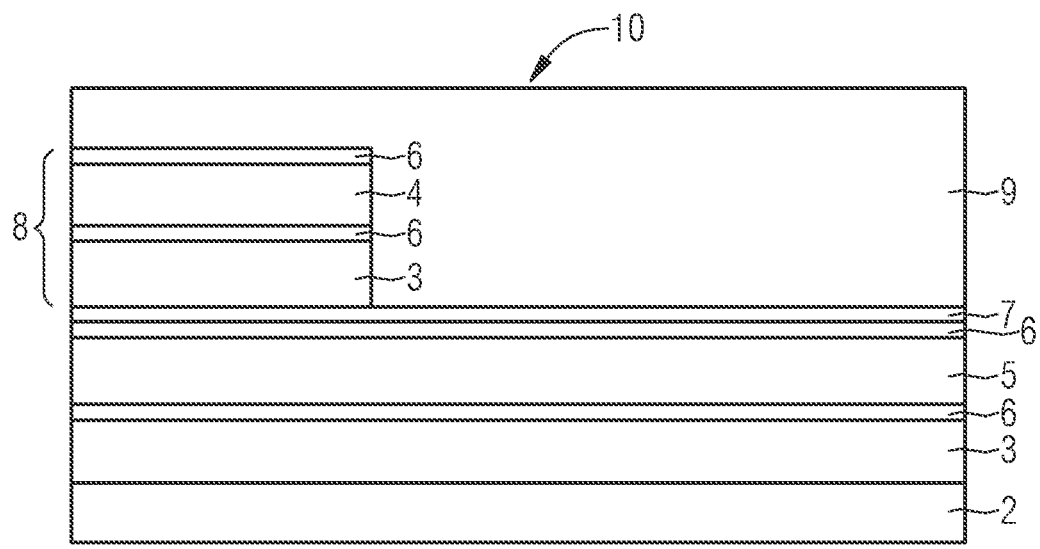

In the next step, schematically shown in FIG. 3, a first planarization layer 9 is applied to the red converting regions 8, which fills the recesses created by the etching to form a first planar surface 10. The first planarization layer 9 is transparent for radiation of the blue spectral range and/or the red spectral range and/or the green spectral range.

Figure 4:
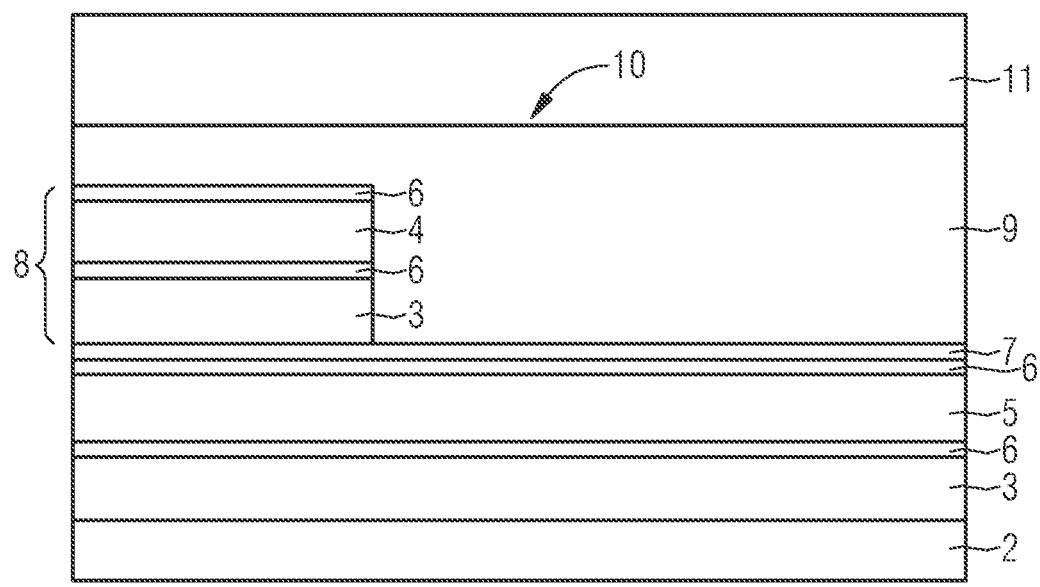

In a further step, schematically shown in FIG. 4, a carrier 11 is applied to the first planar surface 10 of the first planarization layer 9. Carrier 11 mechanically stabilizes the epitaxial conversion element 1 during the subsequent removal of growth substrate 2.

Figure 5:
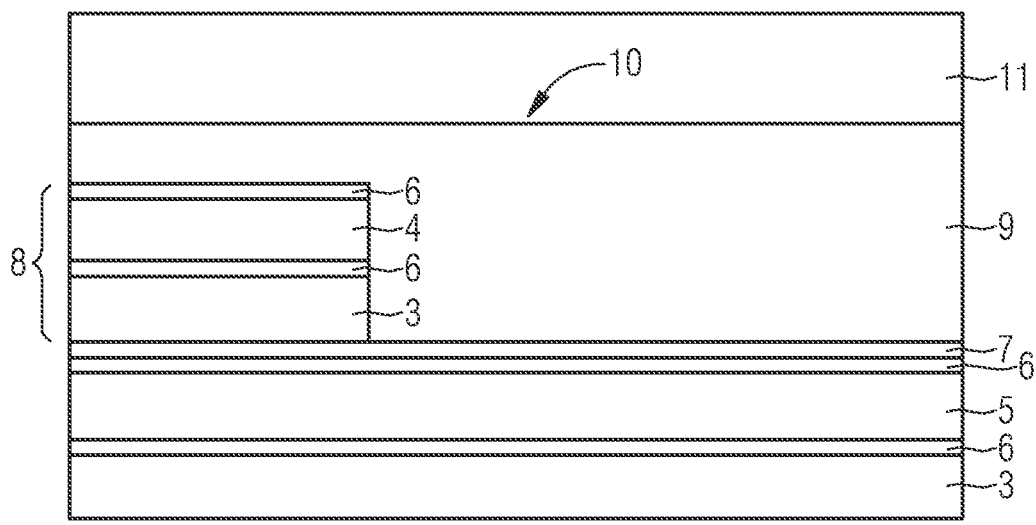

FIG. 5 schematically shows the method stage after the growth substrate 2 has been removed from the layers.

Figure 6:
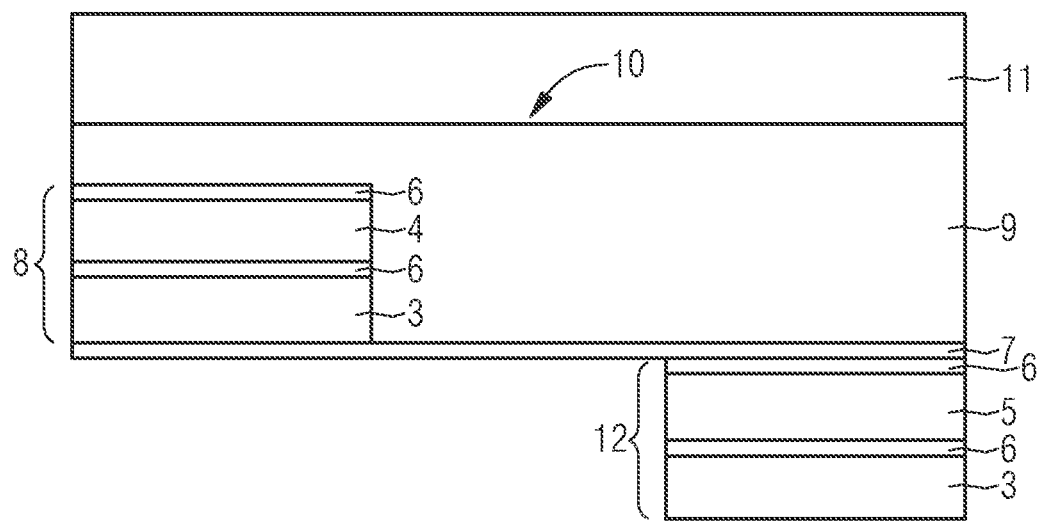

Now also the green converting epitaxial layer 5 is structured into at least one green converting region 12 (FIG. 6). For example, the structuring of the green converting epitaxial layer 5 into the green converting epitaxial region 12 is also done by etching up to the etch stop layer 7.

The present embodiment of the method for producing an epitaxial conversion element 1 shows only one red converting region 8 and one green converting region 12, respectively, but the method is typically performed at wafer level so that the green converting epitaxial layer 5 and the red converting epitaxial layer 4 are structured into a plurality of green converting regions 12 and red converting regions 8, respectively. For reasons of clarity, this is not shown here.

Figure 7:
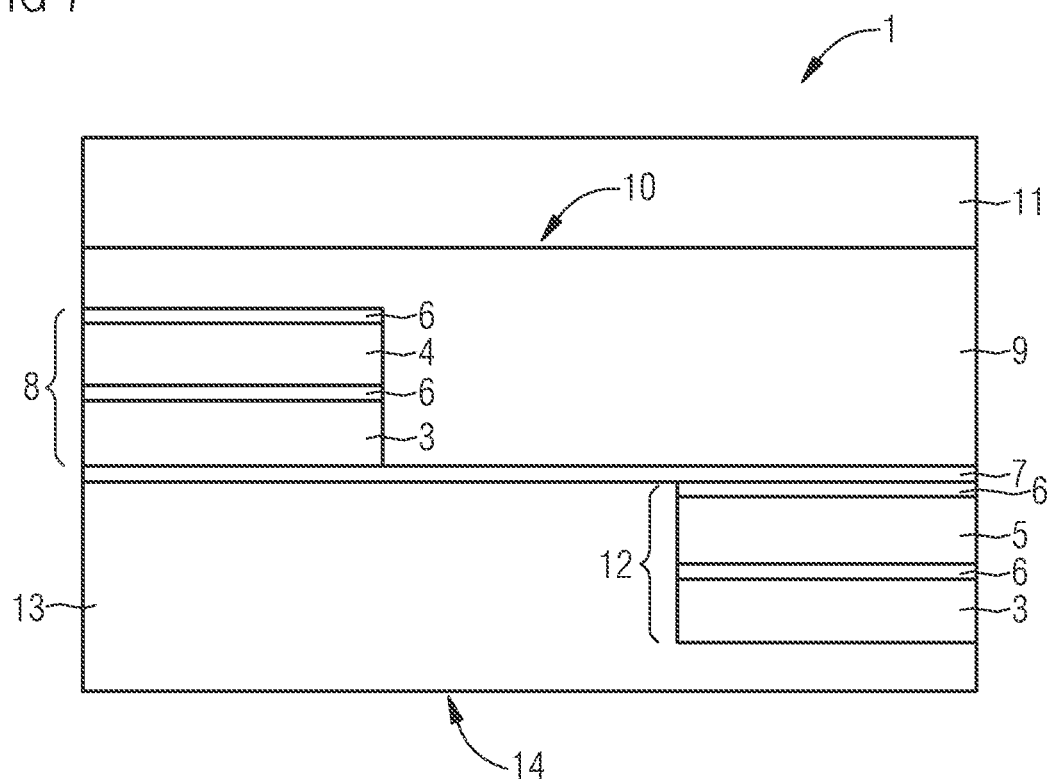

In a next step, a second planarization layer 13 is applied to the green converting epitaxial regions 12, which in turn creates a second planar surface 14 and fills the recesses created by structuring the green converting epitaxial layer 5. The finished epitaxial conversion element 1 is shown schematically in FIG. 7.

Figure 8:
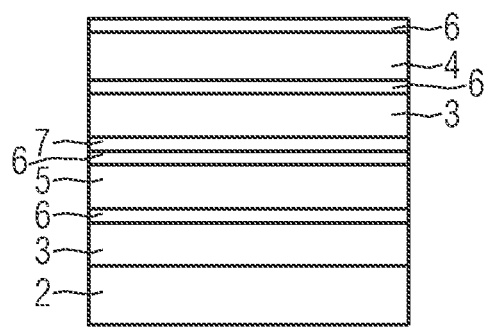
FIG. 8 shows the layer sequence of the epitaxial conversion element according to FIG. 1.
Figure 9:
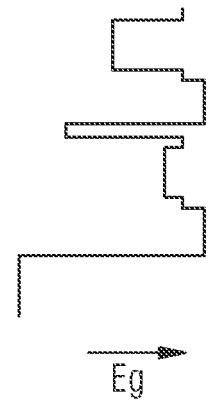
FIG. 9 schematically shows a diagram of the band gaps of the epitaxial semiconductor layer sequence according to the embodiment of FIGS. 1 and 8.

FIG. 8 once again shows the sequence of layers according to FIG. 1, while FIG. 9 opposite shows the corresponding band gaps $E_g$.

According to FIG. 9, the green converting epitaxial layer 5 has a larger band gap $E_g$ than the red converting epitaxial layer 4, the two top layers 3 have a larger band gap $E_g$ than the two converting layers 4, 5 because they are transparent to the green converted radiation of the green converting epitaxial layer 5 and to the red converted radiation of the red converting epitaxial layer 4, the etch stop layer 7 and the growth substrate 2 have a relatively small band gap $E_g$.

Figure 10:
FIGS. 10 to 20 show a method for producing an RGB unit according to an embodiment.
Figure 11:
Figure 12:
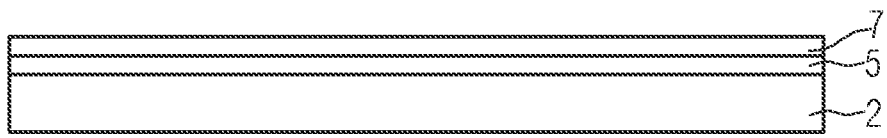
Figure 13:
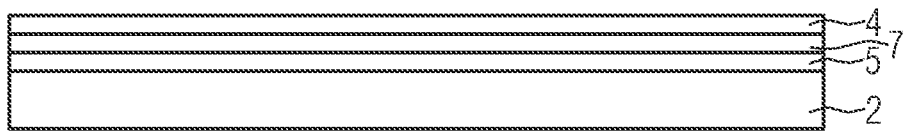

In the method of producing an RGB unit according to the embodiment given in FIGS. 10 to 20, a growth substrate 2 is provided in a first step (FIG. 10). A green converting epitaxial layer 5 is grown epitaxially on growth substrate 2 (FIG. 11). In the next step, schematically shown in FIG. 12, an etch stop layer 7 is applied to the green converting epitaxial layer 5, also preferably epitaxial. Then a red converting epitaxial layer 4 is fully applied to the etch stop layer 7 (FIG. 13).

Figure 14:
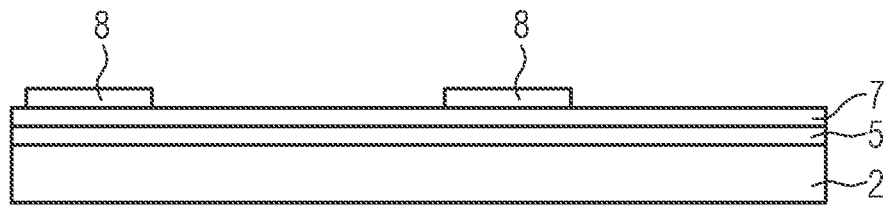

The red converting epitaxial layer 4 is structured into red converting regions 8, for example, by etching. The etching method is stopped by the etch stop layer 7 (FIG. 14).

Figure 15:
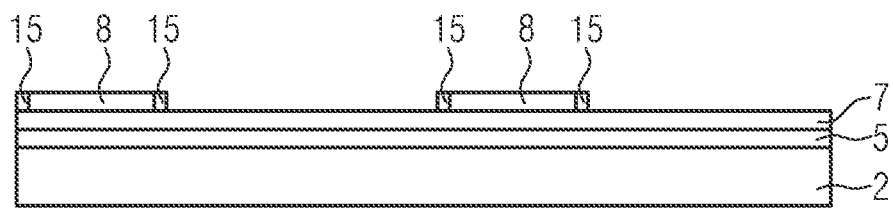

The side surfaces of the red converting regions 8 are provided with a reflective layer 15. The reflective layer 15, for example, is made of a metallic material or of a dielectric material. For example, the reflective layer 15 can be deposited by sputtering or thermal evaporation (FIG. 15).

Figure 16:
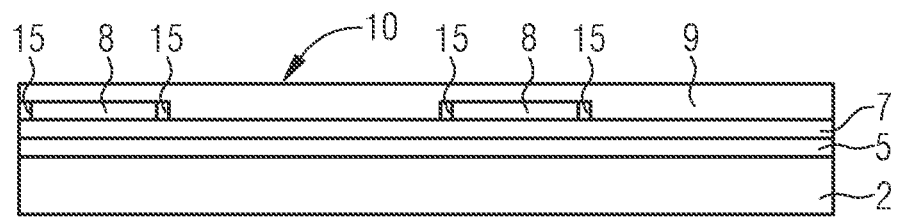

In the next step, schematically shown in FIG. 16, a first planarization layer 9 is applied to the red converting regions 8 to fill the recesses created by etching between the red converting regions 8. The first planarization layer 9 forms a first planar surface 10.

Figure 17:
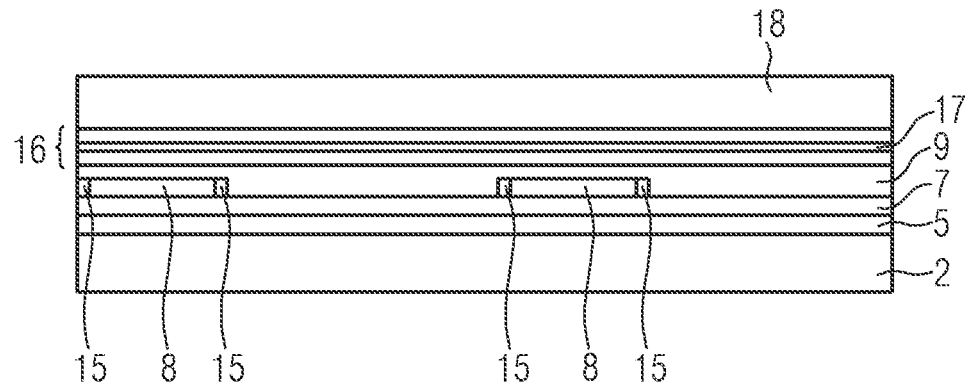

As schematically shown in FIG. 17, an epitaxial semiconductor layer sequence 16 with an active zone 17 is applied to the first planar surface 10 of the first planarization layer 9. The active zone 17 is preferably suitable for emitting electromagnetic radiation from the blue spectral range, which is converted into green light by the green converting regions 12 and into red light by the red converting regions 8. The epitaxial semiconductor layer sequence 16 with the active zone 17 is applied to a carrier element 18.

Figure 18:
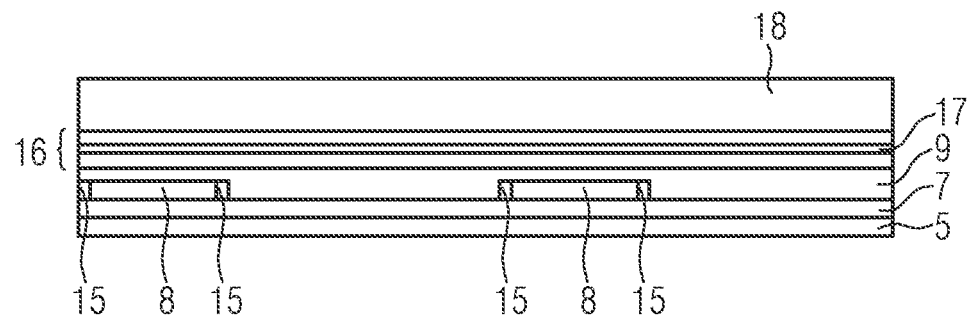
Figure 19:
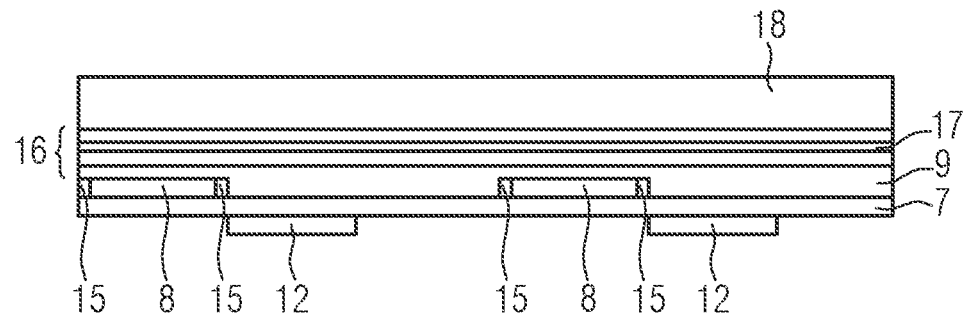

In a next step, schematically shown in FIG. 18, the growth substrate 2 of the green converting epitaxial layer 5 and the red converting epitaxial layer 4 is removed. In this way, the green converting epitaxial layer 5 is freely accessible from outside and can be structured, as schematically shown in FIG. 19, into green converting regions 12, for example, also by etching, wherein the etch stop layer 7 stops the etching method.

The side surfaces of the green converting regions 12 are also provided with a reflective layer 15. The recesses between the green converting regions 12 are then filled with a second planarization layer 13.

Figure 20:
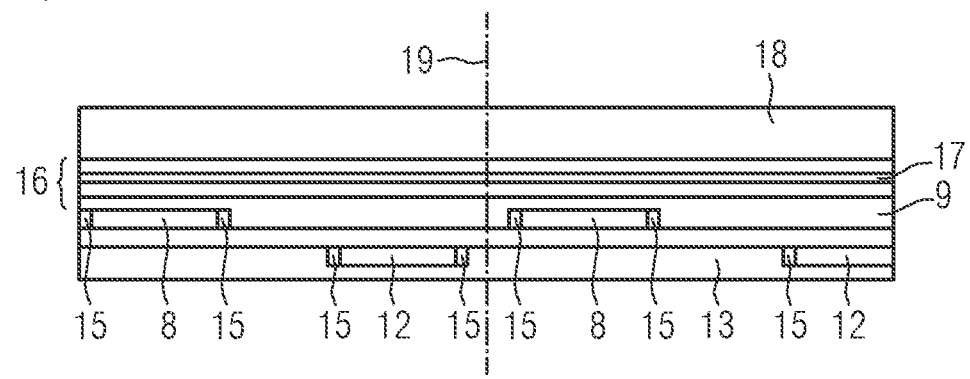

Finally, the various RGB units are separated along dividing lines 19 (FIG. 20). RGB units may be single semiconductor chips, each comprising only individual RGB pixels.

Figure 21:
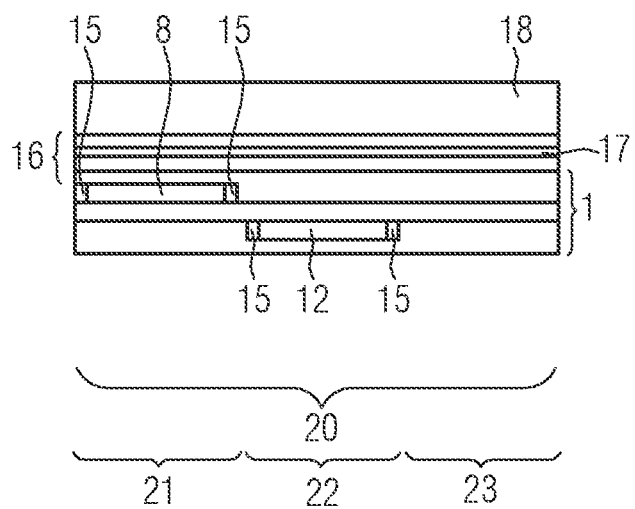
FIG. 21 shows an RGB unit according to an embodiment.

The RGB unit according to the embodiment of FIG. 21 has a green converting region 12 that includes a green converting epitaxial layer 5. Sides of the green converting region 12 are provided with a reflective layer 15. Further, according to FIG. 21, the RGB unit comprises a red converting region 8 comprising a red converting epitaxial layer 4, the side faces of which are also provided with a reflective layer 15.

The green converting region 12 and the red converting region 8 are arranged next to each other according to the embodiment of FIG. 21 and do not overlap laterally. Furthermore, the green converting region 12 and the red converting region 8 are arranged in different main extension planars, which are arranged parallel to each other.

In addition, the RGB unit includes an epitaxial semiconductor layer sequence 16 with an active zone 17 as shown in the embodiment in FIG. 21. The active zone 17 is suitable for generating electromagnetic radiation from the blue spectral range. The epitaxial semiconductor layer sequence 16 also contains a carrier element 18, which mechanically stabilizes the RGB unit.

The red converting region 8 is provided to convert blue light of the active zone 17 into red light, preferably completely. The green converting region 12 is also provided to convert blue light of the active zone 17 into green light, also preferably completely.

The RGB unit shown in FIG. 21 has a radiation exit surface 20 comprising a red emission region 21, a green emission region 22 and a blue emission region 23. The red emission region 21 is subordinate to the red converting region 8 in the direction of radiation. The red converted radiation of the red converting region 8 is emitted from the red emission region 21.

Furthermore, the radiation exit surface 20 of the RGB unit comprises the green emission region 22, which is arranged downstream of the green converting region 12 in the radiation direction and is emitted by the green converted radiation of the green converting region 12.

The blue emission region 23 of the radiation exit surface 20 of the RGB unit according to FIG. 21 emits blue unconverted radiation of the active zone 17.

The three emission regions 21, 22, 23 are arranged laterally next to each other and do not overlap.

The invention is not limited by the description using the embodiments to these. Rather, the invention includes any new feature and any combination of features, which in particular includes any combination of features in the patent claims, even if that feature or combination itself is not explicitly mentioned in the patent claims or embodiments.

What is claimed is:

1. An epitaxial conversion element comprising:
   a green converting epitaxial layer configured to convert electromagnetic radiation from a blue spectral range into electromagnetic radiation of a green spectral range; and
   a red converting epitaxial layer configured to convert electromagnetic radiation from the blue spectral range into electromagnetic radiation of a red spectral range,
   wherein the green converting epitaxial layer and the red converting epitaxial layer are based on a phosphide compound semiconductor material, and
   wherein the green converting epitaxial layer and the red converting epitaxial layer are in different main extension planes which are parallel to each other.

2. The epitaxial conversion element according to claim 1, wherein the green converting epitaxial layer and the red converting epitaxial layer are grown epitaxially on a common growth substrate.

3. The epitaxial conversion element according to claim 1, wherein the green converting epitaxial layer and the red converting epitaxial layer have substantially the same crystal lattice.

4. The epitaxial conversion element according to claim 1, wherein the green converting epitaxial layer and the red converting epitaxial layer have substantially the same lattice constant along their main extension planes.

5. The epitaxial conversion element according to claim 1, wherein the epitaxial conversion element is free of compound bonding layers.

6. The epitaxial conversion element according to claim 1, wherein the red converting epitaxial layer is disposed between two barrier layers.

7. The epitaxial conversion element according to claim 1, wherein the green converting epitaxial layer is disposed between two barrier layers.

8. The epitaxial conversion element according to claim 1, further comprising a top layer arranged between the red converting epitaxial layer and a radiation exit surface of the conversion element and/or between the green converting epitaxial layer and the radiation exit surface of the epitaxial conversion element.

9. The epitaxial conversion element according to claim 1, further comprising:
   a green converting region comprising the green converting epitaxial; and
   a red converting region comprising the red converting epitaxial layer,
   wherein the red converting region and the green converting region do not overlap laterally.

10. The epitaxial conversion element according to claim 9, wherein the green converting region and/or the red converting region has a width not greater than wo micrometers.

11. A method for producing the epitaxial conversion element according to claim 1, the method comprising:
    providing a growth substrate;
    epitaxially depositing the red converting epitaxial layer based on a phosphide compound semiconductor material; and
    epitaxially depositing the green converting epitaxial layer based on a phosphide compound semiconductor material.

12. The method according to claim 11, further comprising:
    structuring the red converting epitaxial layer into a plurality of red converting regions;
    depositing a first transparent planarization layer on the red converting regions thereby forming a first planar surface;
    connecting a carrier to the first planar surface;
    removing the growth substrate; and
    structuring the green converting epitaxial layer into a plurality of green converting regions.

13. A radiation-emitting RGB unit comprising:
    an active zone configured to generate electromagnetic radiation of the blue spectral range; and
    the epitaxial conversion element according to claim 1,
    wherein the green converting epitaxial layer and the red converting epitaxial layer are configured to convert the electromagnetic radiation of the active zone, and
    wherein a main extension plane of the active zone is parallel to the main extension planes of the green converting epitaxial layer and the red converting epitaxial layer.

14. The radiation-emitting RGB unit according to claim 13, further comprising a radiation exit surface comprising a red emission region, a green emission region and a blue emission region, wherein a red converted radiation of the red converting epitaxial layer is emitted from the red emission region during operation, wherein a green converted radiation of the green converting epitaxial layer is emitted from the green emission region during the operation, and wherein a blue unconverted radiation of the active zone is emitted from the blue emission region during the operation.

15. The radiation-emitting RGB unit according to claim 14, wherein the blue emission region and/or the green emission region and/or the red emission region has a width which is not greater than 100 micrometers.

16. A method for producing the radiation-emitting RGB unit according to claim 13, the method comprising:
    providing a growth substrate;
    epitaxially depositing the red converting epitaxial layer;
    epitaxial deposition the green converting epitaxial layer;
    structuring the red converting epitaxial layer into a plurality of red converting regions;

depositing a first transparent planarization layer on the red converting regions thereby forming a first planar surface;
bonding a radiation emitting epitaxial semiconductor layer sequence having an active zone to the first planar surface;
removing the growth substrate; and
structuring the green converting epitaxial layer into a plurality of green converting regions.

17. The method according to claim 16, wherein an etch stop layer is disposed between the green converting epitaxial layer and the red converting epitaxial layer.

18. The method according to claim 16, wherein side surfaces of the red converting regions and/or the green converting regions comprise a mirroring layer.

19. The method according to claim 16, further comprising applying a second transparent planarization layer to the green converting regions thereby forming a second planar surface.

20. The method according to claim 16, further comprising separating the radiation-emitting RGB unit into a large number of RGB semiconductor chips.

\* \* \* \* \*

UNITED STATES PATENT AND TRADEMARK OFFICE
CERTIFICATE OF CORRECTION

PATENT NO. : 10,833,219 B2  
APPLICATION NO. : 16/252323  
DATED : November 10, 2020  
INVENTOR(S) : Alexander Tonkikh Page 1 of 1

It is certified that error appears in the above-identified patent and that said Letters Patent is hereby corrected as shown below:

In the Claims

In Column 12, Line 14, Claim 10, delete "wo" and insert --100--.

Signed and Sealed this
Ninth Day of February, 2021

Drew Hirshfeld
*Performing the Functions and Duties of the*
*Under Secretary of Commerce for Intellectual Property and*
*Director of the United States Patent and Trademark Office*